United States Patent
Chen et al.

(10) Patent No.: US 7,371,648 B2
(45) Date of Patent: May 13, 2008

(54) METHOD FOR MANUFACTURING A TRANSISTOR DEVICE HAVING AN IMPROVED BREAKDOWN VOLTAGE AND A METHOD FOR MANUFACTURING AN INTEGRATED CIRCUIT USING THE SAME

(75) Inventors: Jihong Chen, Plano, TX (US); Srinivasan Chakravarthi, Murphy, TX (US); Eddie H. Breashears, Allen, TX (US); Amitabh Jain, Allen, TX (US)

(73) Assignee: Texas Instruments Incorporated, Dallas, TX (US)

( * ) Notice: Subject to any disclaimer, the term of this patent is extended or adjusted under 35 U.S.C. 154(b) by 71 days.

(21) Appl. No.: 11/469,512

(22) Filed: Sep. 1, 2006

(65) Prior Publication Data

US 2008/0057654 A1    Mar. 6, 2008

(51) Int. Cl.
*H01L 21/336* (2006.01)
*H01L 21/04* (2006.01)
*H01L 21/425* (2006.01)

(52) U.S. Cl. ............... 438/301; 438/510; 438/514; 438/548; 438/766; 257/408; 257/369; 257/E21.335; 257/E21.336; 257/E21.345; 257/E21.633

(58) Field of Classification Search ................ 438/301, 438/510, 514, 548, 766; 257/E21.335, E21.336, 257/E21.345
See application file for complete search history.

(56) References Cited

U.S. PATENT DOCUMENTS

| | | | | |
|---|---|---|---|---|
| 5,372,960 A * | 12/1994 | Davies et al. | ................ | 438/291 |
| 6,847,089 B2 | 1/2005 | Chakravarthi et al. | | |
| 7,018,888 B2 * | 3/2006 | Goodlin et al. | ............. | 438/230 |
| 2006/0024872 A1 * | 2/2006 | Goodlin et al. | ............. | 438/196 |

* cited by examiner

*Primary Examiner*—Michael Lebentritt
*Assistant Examiner*—Mohsen Ahmadi
(74) *Attorney, Agent, or Firm*—Frederick J. Telecky, Jr.; Wade J. Brady, III

(57) ABSTRACT

The present invention provides a method for manufacturing a transistor device, and a method for manufacturing an integrated circuit including the same. The method for manufacturing the transistor device, among other elements, includes forming a gate structure over a substrate, implanting an atom selected from the group consisting of fluorine, silicon, or germanium into the substrate proximate the gate structure to cause at least a portion of the substrate to be in a sub-amorphous state, and implanting a dopant into the substrate having the implanted atom therein, thereby forming source/drain regions in the substrate, wherein the transistor device does not have a halo/pocket implant.

16 Claims, 3 Drawing Sheets

METHOD FOR MANUFACTURING A TRANSISTOR DEVICE HAVING AN IMPROVED BREAKDOWN VOLTAGE AND A METHOD FOR MANUFACTURING AN INTEGRATED CIRCUIT USING THE SAME

TECHNICAL FIELD OF THE INVENTION

The present invention is directed, in general, to a method for manufacturing a transistor device and, more specifically, to a method for manufacturing a transistor device having an improved breakdown voltage and a method for manufacturing an integrated circuit using the same.

BACKGROUND OF THE INVENTION

It is often necessary in linear mixed-signal CMOS and BiCMOS integrated circuit devices to merge low-voltage (0.8-1.5 volts, for example) and high-voltage (1.8-5 volts, for example) CMOS devices. Generally, the low-voltage CMOS devices are used for digital logic, while the high-voltage CMOS devices are used in the analog portion of the circuit design, including providing power to flash memory devices. There is currently a desire that the high-voltage CMOS devices have a high breakdown voltage for system on a chip applications, for example greater than 10-volt breakdown voltages, to support programming and writing functions.

A problem currently exists with the high-voltage CMOS devices, in that as the low-voltage CMOS device technology scales in size, the breakdown voltages attainable by the high-voltage CMOS devices decreases due to process changes. Namely, as the gate length of the low-voltage CMOS devices decreases, and in turn the poly gate thickness of the high-voltage CMOS devices decreases, the manufacturing process is limited to lower source/drain implant energies and less effective anneal processes for low-voltage CMOS devices. Because high-voltage CMOS devices and low-voltage CMOS devices are on the same chip, what results is a more abrupt PN junction between the source/drain regions and the channel region, which in turn results in a higher electrical field, and thus lower breakdown voltage for the high-voltage CMOS devices. Unfortunately, the breakdown voltages achievable for the high-voltage CMOS devices having the abrupt PN junction are often insufficient.

Accordingly, what is needed in the art is a method for manufacturing CMOS devices that accommodates the continued desire to scale while providing improved breakdown voltage characteristics.

SUMMARY OF THE INVENTION

To address the above-discussed deficiencies of the prior art, the present invention provides a method for manufacturing a transistor device, and a method for manufacturing an integrated circuit including the same. The method for manufacturing the transistor device, among other elements, includes forming a gate structure over a substrate, implanting an atom selected from the group consisting of fluorine, silicon, or germanium into the substrate proximate the gate structure to cause at least a portion of the substrate to be in a sub-amorphous state, and implanting a dopant into the substrate having the implanted atom therein, thereby forming source/drain regions in the substrate.

As previously indicated, the present invention also provides a method for manufacturing an integrated circuit. The method for manufacturing the integrated circuit, without limitation, includes forming transistor devices over a substrate as indicated above, and the forming dielectric layers over the transistor devices, the dielectric layer having interconnects located therein for contacting the transistor devices and forming an operational integrated circuit.

The foregoing has outlined preferred and alternative features of the present invention so that those skilled in the art may better understand the detailed description of the invention that follows. Additional features of the invention will be described hereinafter that form the subject of the claims of the invention. Those skilled in the art should appreciate that they can readily use the disclosed conception and specific embodiment as a basis for designing or modifying other structures for carrying out the same purposes of the present invention. Those skilled in the art should also realize that such equivalent constructions do not depart from the spirit and scope of the invention.

BRIEF DESCRIPTION OF THE DRAWINGS

The invention is best understood from the following detailed description when read with the accompanying FIGURES. It is emphasized that in accordance with the standard practice in the semiconductor industry, various features are not drawn to scale. In fact, the dimensions of the various features may be arbitrarily increased or reduced for clarity of discussion. Reference is now made to the following descriptions taken in conjunction with the accompanying drawings, in which.

DETAILED DESCRIPTION

The present invention is based, at least in part, on the acknowledgment that as low-voltage transistor technologies scale from sub 0.2 µm to sub 0.1 µm, the anneal processes and implant energies associated with the reduced dimensions, causes the high-voltage transistors to have an abrupt PN junction between the source/drain regions and the channel region. In turn, the present invention has acknowledged that the abrupt PN junction for these high-voltage transistors causes higher electrical fields, and thus lower breakdown voltages.

Given these acknowledgments, the present invention has recognized that by making the implant used to form the source/drain regions, and particularly the implant used to form the source/drain extension implants, easier to diffuse, the drawbacks associated with the anneal process and implant energies may be reduced. In one embodiment, the present invention acknowledged that by implanting particular atoms into the substrate prior to or in conjunction with the formation of the source/drain regions, the diffusion of the implants used to form the source/drain regions could be dramatically increased (e.g., for a given anneal process, implant energy and implant dose). Thus the abrupt PN junction could be reduced. In one exemplary embodiment the implanted atoms are selected from the group consisting of fluorine, silicon or germanium.

Figure 1:
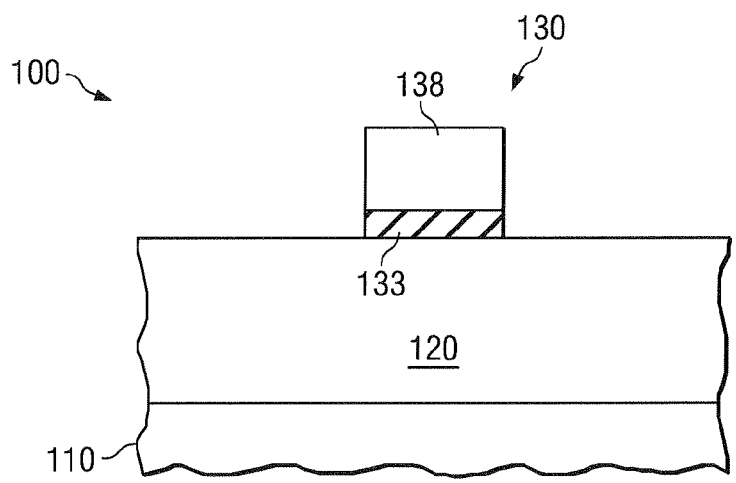
FIG. 1 illustrates a partially completed transistor device manufactured in accordance with the principles of the present invention.

Turning now to FIGS. 1-6, illustrated are cross-sectional views of detailed manufacturing steps illustrating how one might manufacture a transistor device, in this embodiment a high-voltage transistor device, in accordance with the principles of the present invention. FIG. 1 illustrates a partially completed transistor device 100 manufactured in accordance with the principles of the present invention. From the outset, it should be noted that the embodiment of FIGS. 1-6 will be discussed as an n-channel metal oxide semiconductor (NMOS) device. In an alternative embodiment, all the dopant types, except for possibly the substrate dopant, could be reversed, resulting in a p-channel metal oxide semiconductor (PMOS) device. In all likelihood, located next to the transistor device 100 would be another transistor device of opposite type, thus forming a complementary metal oxide semiconductor (CMOS) device. However, at least with regard to FIGS. 1-6, no further reference to these opposite schemes will be discussed.

In the embodiment shown, the transistor device 100 of FIG. 1 includes a substrate 110. The substrate 110 may, in one embodiment, be any layer located in the transistor device 100, including a wafer itself or a layer located above the wafer (e.g., epitaxial layer). Moreover, the substrate 110 is generally formed from a semiconductor material, such as silicon or polysilicon. However, the substrate 110 may also be formed from other materials such as gallium arsenide, germanium, silicon-germanium, epitaxial formations, silicon carbide, indium phosphide, silicon-on-insulator substrates (SOI), strained silicon substrates, and/or other semiconductor substrate materials. Nevertheless, in the illustrative embodiment shown, the substrate 110 comprises an epitaxial silicon layer. In the embodiment illustrated in FIG. 1, the substrate 110 is a P-type substrate; however, one skilled in the art understands that the substrate 110 could conceivably be an N-type substrate without departing from the scope of the present invention.

Located within the substrate 110 in the embodiment shown in FIG. 1 is a well region 120. The well region 120 in this embodiment contains a P-type dopant. For example, the well region 120 would likely be doped with a P-type dopant dose ranging from about 1E13 atoms/cm$^2$ to about 1E14 atoms/cm$^2$ and at an energy ranging from about 100 keV to about 500 keV. This results in the well region 120 having a peak dopant concentration ranging from about 5E17 atoms/cm$^3$ to about 1E19 atoms/cm$^3$. Those skilled in the art understand that in certain circumstances where the P-type substrate 110 dopant concentration is high enough, the well region 120 may be excluded.

Located over the substrate 110 in the embodiment of FIG. 1 is a gate structure 130. The gate structure 130 includes a gate dielectric 133 and a gate electrode 138. The gate dielectric 133 may comprise a number of different materials and stay within the scope of the present invention. For example, the gate dielectric 133 may comprise silicon dioxide, oxynitride or in an alternative embodiment comprise a high dielectric constant (K) material. In the illustrative embodiment of FIG. 1, however, the gate dielectric 133 is a silicon dioxide layer having a thickness ranging from about 2 nm to about 50 nm. As those skilled in the art appreciate, these thicknesses cover transistor devices, such as those that might be associated with memory devices.

Any one of a plurality of manufacturing techniques could be used to form the gate dielectric 133. For example, the gate dielectric 133 may be either grown or deposited. Additionally, the growth or deposition steps may require a significant number of different temperatures, pressures, gasses, flow rates, etc.

While the embodiment of FIG. 1 discloses that the gate electrode 138 comprises standard polysilicon, other embodiments exist where the gate electrode 138, or at least a portion thereof, comprises amorphous polysilicon material, a metal material, or fully silicided metal material.

The deposition conditions for the gate electrode 138 may vary. However, if the gate electrode 138 were to comprise standard polysilicon, such as the instance in FIG. 1, the gate electrode 138 could be deposited using a pressure ranging from about 100 torr to about 300 torr, a temperature ranging from about 620° C. to about 700° C., and a $SiH_4$ or $Si_2H_6$ gas flow ranging from about 50 sccm to about 150 sccm. If, however, the gate electrode 138 was to comprise a different material, the deposition conditions could change significantly. In any instance, the gate electrode 138 would desirably have a thickness ranging from about 50 nm to about 1000 nm.

Figure 2:
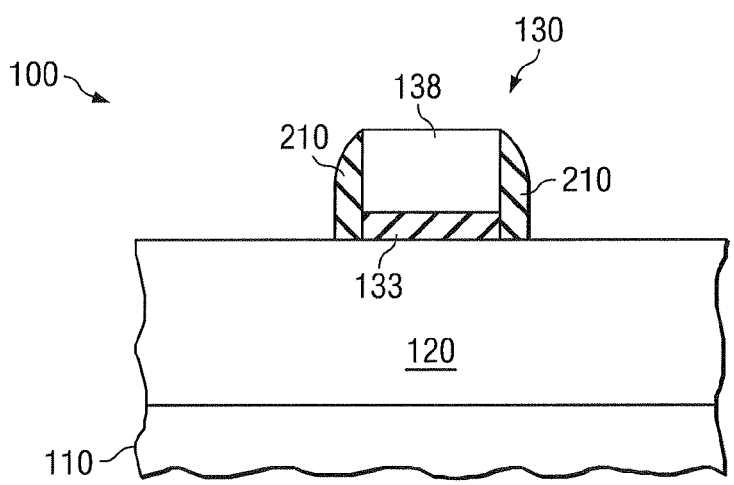
FIG. 2 illustrates the partially completed transistor device illustrated in FIG. 1 after forming optional protective spacers along sidewalls of the gate structure.

Turning briefly to FIG. 2 illustrated is the transistor device 100 illustrated in FIG. 1 after forming optional protective spacers 210 along sidewalls of the gate structure 130. The protective spacers 210, in the embodiment shown, comprise any material that is currently known or hereafter discovered for use as a sidewall spacer in a transistor device. Certain well-known materials that the protective spacers 210 may comprise are an oxide, nitride or oxynitride. Nevertheless, the embodiment of the present invention discussed with respect to FIG. 2, has the protective spacers 210 comprising an oxide.

The protective spacers 210 are often formed by growing or depositing a blanket layer of a protective spacer material over the substrate 110, and then subjecting the blanket layer to an anisotropic etch, resulting in the protective spacers 210. Other embodiments may also exist wherein the protective spacers 210 are formed using other techniques. The protective spacers 210 ideally protect the sidewalls of the gate structure 130 from subsequent processes, including subsequent implant and/or deposition steps.

Figure 3:
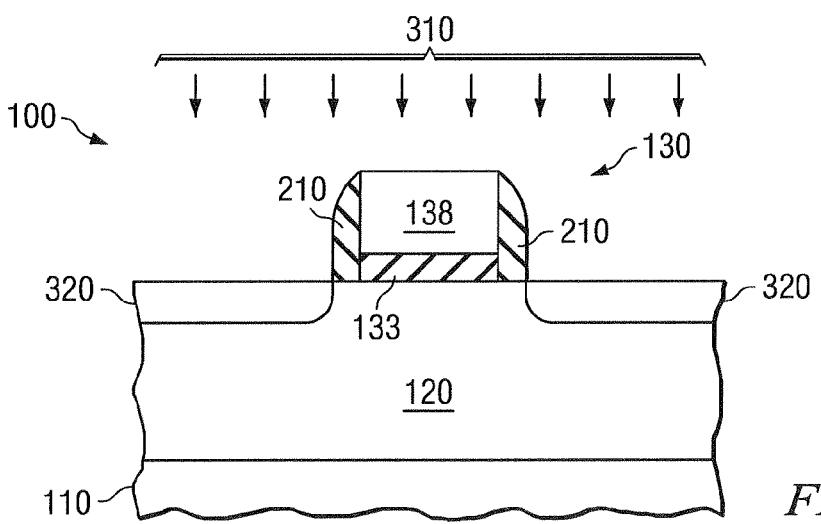
FIG. 3 illustrates the partially completed transistor device illustrated in FIG. 2 after implanting an atom selected from the group consisting of fluorine, silicon, or germanium into the substrate proximate the gate structure.

Turning now to FIG. 3, illustrated is the transistor device 100 illustrated in FIG. 2 after implanting an atom 310 selected from the group consisting of fluorine, silicon, or germanium into the substrate 110 proximate the gate structure 130. As is illustrated in the embodiment of FIG. 3, the atom 310 causes at least a portion of the substrate 110 to be in a sub-amorphous state 320. As the substrate 110 is in a sub-amorphous state 320, the silicon lattice typically only has point defects, and is therefore still distinguishable (as compared to an amorphous state wherein the silicon lattice is damages extensively and looses crystallinity). The sub-amorphous state 320, in one embodiment, extends into the substrate at least a distance (d) of about 20 nm, but in another embodiment extends into the substrate 110 a distance (d) ranging from about 60 nm to about 200 nm. Such distances may be important to the present invention.

The sub-amorphous state 320, depending on the atom 310 being implanted, may be formed using a variety of different conditions. For example, in one embodiment wherein the atom 310 is fluorine, the fluorine may be implanted using an energy ranging from about 10 keV to about 50 keV and a dose ranging from about 1E14 atoms/cm$^2$ to about 8e14 atoms/cm$^2$. In an alternative embodiment wherein the atom 310 is silicon, the silicon may be implanted using an energy ranging from about 30 keV to about 2000 keV and a dose ranging from about 1E13 atoms/cm$^2$ to about 5e14 atoms/cm$^2$. In an embodiment wherein the atom 310 is germanium, the germanium may be implanted using an energy ranging from about 40 keV to about 100 keV and a dose ranging from about 1E13 atoms/cm$^2$ to about 2e14 atoms/cm$^2$. While ranges have been given for the implant energy and implant dose of each of fluorine, silicon, and germanium, other embodiments may exist using implant conditions outside of the ranges given. Nevertheless, the disclosed ranges for the particular atoms 310 may provide superior results.

Figure 4:
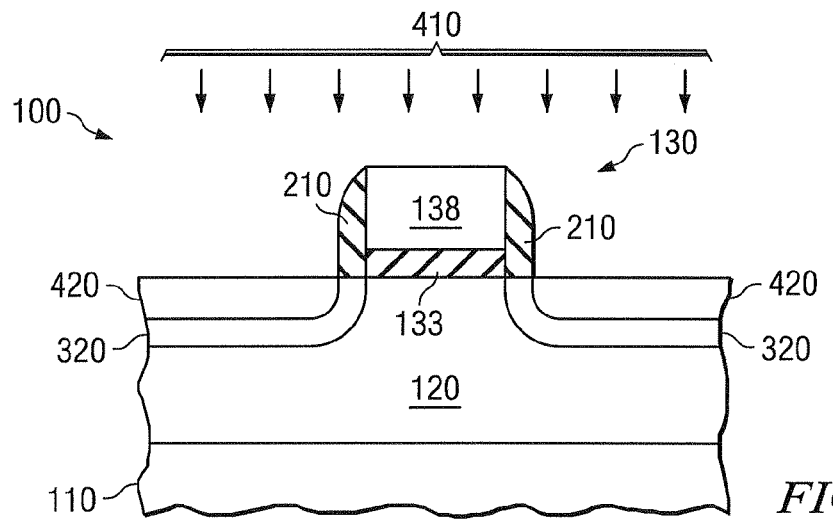
FIG. 4 illustrates the partially completed transistor device illustrated in FIG. 3 after implanting a dopant into the substrate, thereby forming source/drain extension implants within the substrate.

Turning now to FIG. 4, illustrated is the transistor device 100 illustrated in FIG. 3 after implanting a dopant 410 into the substrate 110, thereby forming source/drain extension implants 420 within the substrate 110. The source/drain extension implants 420 may be conventionally formed and generally have a peak dopant concentration ranging from about 1E19 atoms/cm$^3$ to about 2E20 atoms/cm$^3$. As is often standard in the industry, the source/drain extension implants 420 have a dopant type opposite to that of the well region 120 they are located within. Accordingly, the source/drain extension implants 420 are doped with an N-type dopant in the illustrative embodiment shown in FIG. 4.

The dose and energy used to form the source/drain extension implants 420 may vary greatly. In one embodiment of the invention, however, the energy used to implant the source/drain extension implants 420 ranges from about 10 keV to about 200 keV, and in another embodiment from about 40 keV to about 150 keV. Similarly, in one embodiment of the invention the dose used to implant the dopant 410 to form the source/drain extension implants 420 ranges from about 1E13 atoms/cm$^2$ to about 2E15 atoms/cm$^2$, and in another embodiment from about 1E13 atoms/cm$^2$ to about 1E15 atoms/cm$^2$. It is important during the implanting of the source/drain extension implants 420 that the energy and dose are low enough not to implant through the gate structure 130.

When the energy and dose used to implant the source/drain extension implants 420 are low, as required, the source/drain extension implants 420 will typically not form properly. Advantageous to the present invention, however, the inclusion of the atom 310 within the substrate 110, allows the lower energies and doses to be used while allowing the source/drain extension implants 420 to be properly located. Particularly, the atom 310 allows the source/drain extension implants 420 to diffuse easier than if the atom 310 were not present. Accordingly, the source/drain extension implants 420 may have a less abrupt PN junction with the channel region, thereby leading to a lower electrical field, and thus increased breakdown junction. Uniquely, the inclusion of the atom 310 may also be specifically tailored/tuned for the source/drain extension implant 420, and thus the electrical field and breakdown junction may be tailored/tuned.

Notice how the transistor device 100 of FIG. 4 does not include halo/pocket implants. The term halo/pocket implant, as used herein, means an implant that is deeper than the source/drain extension implants and has the same polarity as channel doping. Moreover, the halo/pocket implant may be used to reduce source/drain sub-threshold leakage and short channel effect. This feature is particular to high-voltage transistor devices, as compared to their lower voltage counterparts. As the transistor device 100 does not contain halo/pocket implants, there is no concern of the atom 310 causing the halo/pocket implants to undesirably move.

After implanting the dopant 410 into the substrate 110 to form the source/drain extension implants 420, the transistor device 100 may be subjected to an anneal. Among other temperatures, the anneal may be conducted using a temperature ranging from about 600° C. to about 1100° C. for a time period ranging from about 0.5 seconds to about 20000 seconds. Other temperatures and times could nevertheless be used and remain within the purview of the present invention.

Figure 5:
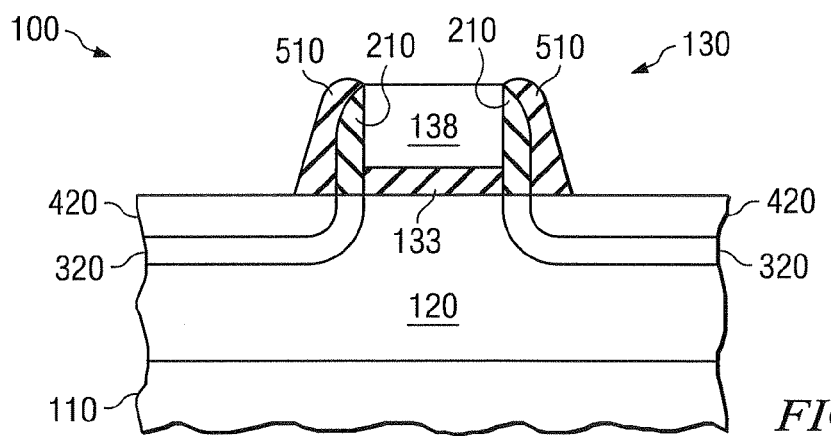
FIG. 5 illustrates the partially completed transistor device illustrated in FIG. 4 after forming portions of gate sidewall spacers.

Turning now to FIG. 5, illustrated is the transistor device 100 illustrated in FIG. 4 after forming gate sidewall spacers 510. The gate sidewall spacers 510 may take on a number of different gate sidewall spacer configurations while staying within the purview of the present invention. In the particular embodiment of FIG. 5, however, the gate sidewall spacers 510 comprise an oxide that has been blanket deposited over the substrate 110 and anisotropically etched. In this embodiment, the thickness of the blanket layer of oxide may be chosen to space the source/drain contact implants 610 (FIG. 6) away from the gate structure 130 a given distance. Another embodiment might require that the gate sidewall spacers 510 comprise an L-shaped spacer having one or more different layers.

Figure 6:
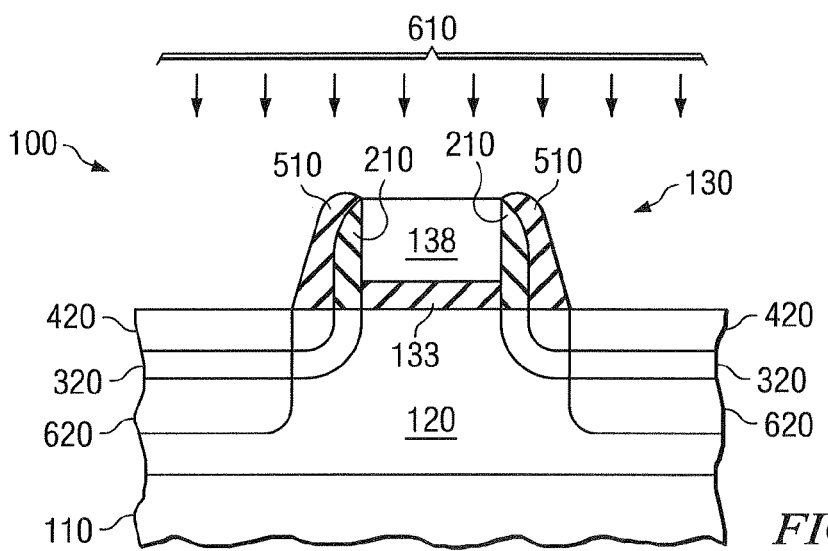
FIG. 6 illustrates the partially completed transistor device illustrated in FIG. 5 after implanting a dopant into the substrate to from source/drain contact implants within the substrate.

Turning now to FIG. 6, illustrated is the transistor device 100 illustrated in FIG. 5 after implanting a dopant 610 into the substrate 110 to form source/drain contact implants 620 within the substrate 110. Those skilled in the art understand the conventional processes that might be used to form the source/drain contact implants 620. Generally the source/drain contact implants 620 have a peak dopant concentration ranging from about 1E18 atoms/cm$^3$ to about 1E21 atoms/cm$^3$. Also, the source/drain contact implants 620 should typically have a dopant type opposite to that of the well region 120 they are located within. Accordingly, in the illustrative embodiment shown in FIG. 6, the source/drain contact implants 620 are doped with an N-type dopant. After completing the source/drain contact implants 620, the manufacture of the transistor device 100 would continue in a conventional fashion, ultimately resulting in a completed transistor device.

Transistor devices manufactured according to the principles of the present invention benefit greatly, as compared to transistor devices manufactured using conventional processes. First, and foremost, the present invention provides for a less abrupt PN junction between the source/drain regions, and particularly the source/drain extension implants in one embodiment, and the channel region. This is particularly important to high-voltage transistor devices. Accordingly, devices manufactured using the principles of the present invention, because of the less abrupt PN junction, tend to have lower electrical fields, and thus increased breakdown voltages. Additionally, the principles of the present invention add minimal process complexity, and have the advantage of providing a method to selectively introduce the sub-amorphous state to the transistor devices independent of some of the other devices, thereby increasing the breakdown voltage of the transistor devices without impacting other core device performance. Moreover, by adjusting the implant conditions of the atom, the diffusion of the source/drain regions can be tuned.

Figure 7:
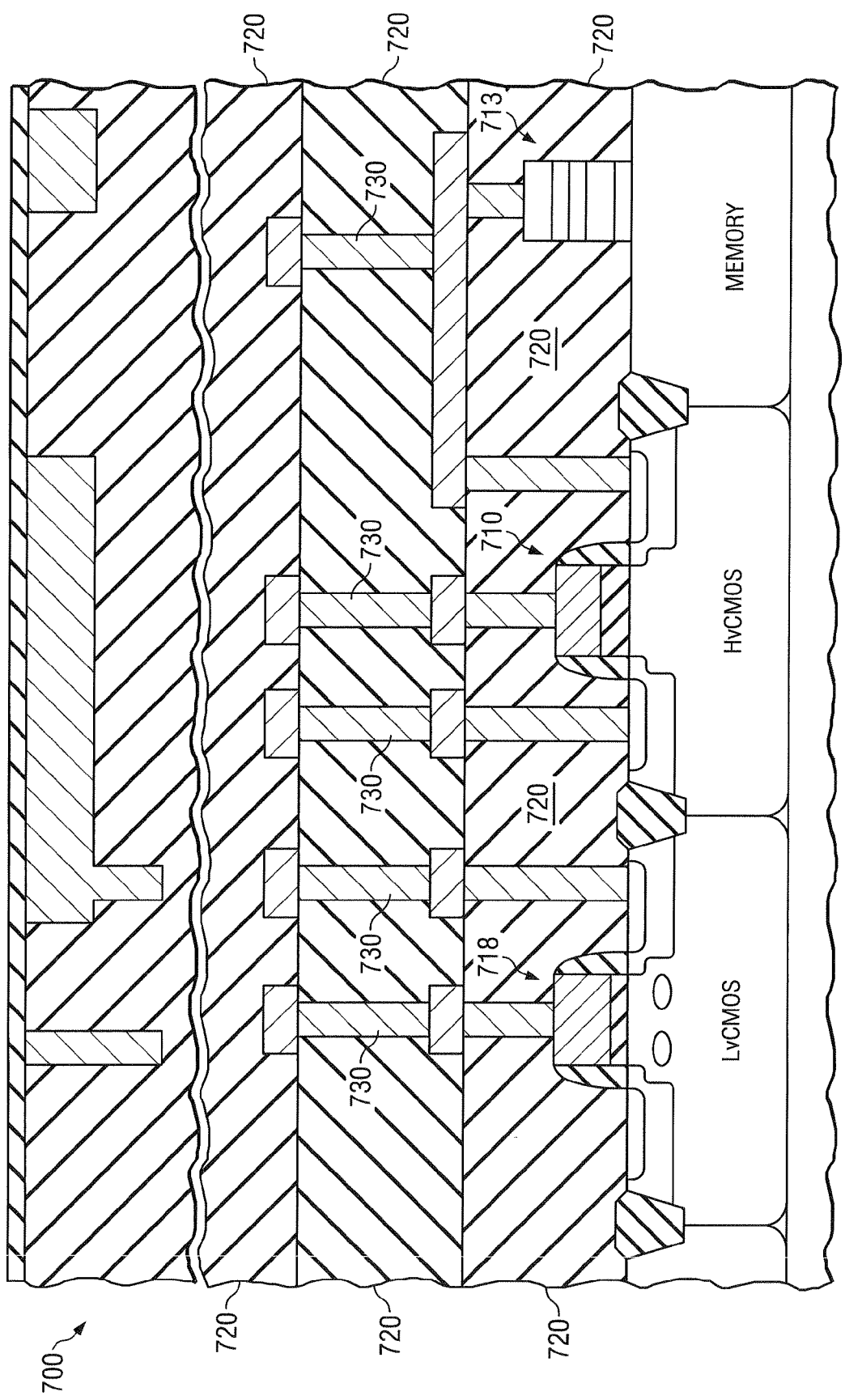
FIG. 7 illustrates a cross-sectional view of a conventional integrated circuit (IC) incorporating a transistor device constructed according to the principles of the present invention.

Referring finally to FIG. 7, illustrated is a cross-sectional view of a conventional integrated circuit (IC) 700 incorporating a transistor device 710 constructed according to the principles of the present invention. The IC 700 illustrated in FIG. 7 further includes a memory cell 713, typically associated with the transistor device 710, and a low-voltage transistor device 718. The IC 700 may include additional devices, such as transistors used to form other CMOS devices, BiCMOS devices, Bipolar devices, or other types of devices. The IC 700 may further include passive devices, such as inductors or resistors, or it may also include optical devices or optoelectronic devices. Those skilled in the art are familiar with these various types of devices and their manufacture. In the particular embodiment illustrated in FIG. 7, the IC 700 includes dielectric layers 720 located over the transistor device 710, memory cell 713 and low-voltage transistor device 718. Additionally, interconnect structures 730 are located within the dielectric layers 720 to interconnect various devices, thus, forming the operational integrated circuit 700.

Although the present invention has been described in detail, those skilled in the art should understand that they could make various changes, substitutions and alterations herein without departing from the spirit and scope of the invention in its broadest form.

What is claimed is:

1. A method for manufacturing a transistor device, comprising:
    forming a gate structure over a substrate;
    implanting an atom selected from the group consisting of fluorine, silicon, or germanium into the substrate proximate the gate structure to cause at least a portion of the substrate to be in a sub-amorphous state;
    implanting a dopant into the substrate having the implanted atom therein, thereby forming source/drain extension implants in the substrate, wherein the transistor device does not have a halo/pocket implant;
    forming sidewall spacers along sidewalls of the gate structure after implanting the dopant; and
    forming source/drain contact implants in the substrate after forming the sidewall spacers.

2. The method as recited in claim 1 wherein the implanting the atom occurs directly before the implanting the dopant.

3. The method as recited in claim 1 wherein implanting the dopant includes implanting the dopant using an energy ranging from about 10 keV to about 200 keV.

4. The method as recited in claim 1 wherein the atom is fluorine and the fluorine is implanted using an energy ranging from about 10 keV to about 50 keV and a dose ranging from about 1E14 atoms/cm$^2$ to about 8E14 atoms/cm$^2$.

5. The method as recited in claim 1 wherein the atom is silicon and the silicon is implanted using an energy ranging from about 30 keV to about 2000 keV and a dose ranging from about 1E13 atoms/cm$^2$ to about 5E14 atoms/cm$^2$.

6. The method as recited in claim 1 wherein the atom is germanium and the germanium is implanted using an energy ranging from about 40 keV to about 100 keV and a dose ranging from about 1E13 atoms/cm$^2$ to about 2E14 atoms/cm$^2$.

7. The method as recited in claim 1 further including forming an oxide protective spacer along sidewalls of the gate structure before implanting the dopant.

8. A method for manufacturing an integrated circuit, comprising:
    forming transistor devices over or in a substrate, including;
        forming gate structures over the substrate;
        implanting an atom selected from the group consisting of fluorine, silicon, or germanium into the substrate proximate the gate structures to cause at least a portion of the substrate to be in a sub-amorphous state;
        implanting a dopant into the substrate having the implanted atom therein, thereby forming source/drain extension implants in the substrate proximate the gate structures, wherein the transistor devices do not have a halo/pocket implant;
        forming sidewall spacers along sidewalls of the gate structure after implanting the dopant; and
        forming source/drain contact implants in the substrate after forming the sidewall spacers; and
    forming dielectric layers over the transistor devices, the dielectric layers having interconnects therein for contacting the transistor devices and forming an operational integrated circuit.

9. The method as recited in claim 8 wherein the implanting the atom occurs directly before the implanting the dopant.

10. The method as recited in claim 8 wherein implanting the dopant includes implanting the dopant using an energy ranging from about 10 keV to about 200 keV.

11. The method as recited in claim 8 wherein the atom is fluorine and the fluorine is implanted using an energy ranging from about 10 keV to about 50 keV and a dose ranging from about 1E14 atoms/cm$^2$ to about 8E14 atoms/cm$^2$.

12. The method as recited in claim 8 wherein the atom is silicon and the silicon is implanted using an energy ranging from about 30 keV to about 2000 keV and a dose ranging from about 1E13 atoms/cm$^2$ to about 5E14 atoms/cm$^2$.

13. The method as recited in claim 8 wherein the atom is germanium and the germanium is implanted using an energy ranging from about 40 keV to about 100 keV and a dose ranging from about 1E13 atoms/cm$^2$ to about 2E14 atoms/cm$^2$.

14. The method as recited in claim 8 further including forming an oxide protective spacer along sidewalls of the gate structure before implanting the dopant.

15. A method for manufacturing an integrated circuit comprising:
    forming transistor devices over or in a substrate, including;
        forming gate structures over the substrate;
        forming a protective spacer along sidewalls of the gate structure;
        implanting an atom selected from the group consisting of fluorine, silicon, or germanium into the substrate proximate the gate structures having the protective spacer to cause at least a portion of the substrate to be in a sub-amorphous state;
        implanting a dopant into the substrate having the implanted atom therein and using an energy ranging from about 10 keV to about 200 keV, thereby forming source/drain extension implants in the substrate proximate the gate structures, wherein the transistor devices do not have a halo/pocket implant;
        forming sidewall spacers along sidewalls of the gate structure after implanting the dopant; and
        forming source/drain contact implants in the substrate after forming the sidewall spacers; and
    forming dielectric layers over the transistor devices, the dielectric layers having interconnects therein for contacting the transistor devices and forming an operational integrated circuit.

16. The method of claim 15 wherein the implanting the atom causes the sub-amorphous state to extend at least 20 nm into the substrate.

* * * * *